(12) United States Patent
Hirabayashi

(10) Patent No.: US 8,185,793 B2
(45) Date of Patent: May 22, 2012

(54) DATA REPRODUCING APPARATUS

(75) Inventor: Masayuki Hirabayashi, Yokohama (JP)

(73) Assignees: Hitachi, Ltd., Tokyo (JP); Hitachi-LG Data Storage, Inc., Tokyo (JP)

( * ) Notice: Subject to any disclaimer, the term of this patent is extended or adjusted under 35 U.S.C. 154(b) by 1092 days.

(21) Appl. No.: 12/079,495

(22) Filed: Mar. 26, 2008

(65) Prior Publication Data

US 2008/0270869 A1    Oct. 30, 2008

(30) Foreign Application Priority Data

Apr. 25, 2007    (JP) ................... 2007-114996

(51) Int. Cl.
*G06F 11/00*    (2006.01)
(52) U.S. Cl. .................... 714/752; 714/751; 714/758
(58) Field of Classification Search .......... None
See application file for complete search history.

(56) References Cited

U.S. PATENT DOCUMENTS

| 5,063,565 | A | * | 11/1991 | Ohashi .......................... 714/764 |
| 5,920,579 | A | | 7/1999 | Nagai et al. |
| 7,900,125 | B1 | * | 3/2011 | Liu et al. ....................... 714/799 |
| 7,984,359 | B2 | * | 7/2011 | Gorfajn et al. ................. 714/764 |
| 2002/0016942 | A1 | * | 2/2002 | MacLaren et al. ............ 714/718 |
| 2009/0164870 | A1 | * | 6/2009 | Penton et al. .................. 714/764 |

FOREIGN PATENT DOCUMENTS

JP    2003-173633    6/2003

* cited by examiner

*Primary Examiner* — Christopher McCarthy
(74) *Attorney, Agent, or Firm* — Kilpatrick Townsend & Stockton LLP

(57) ABSTRACT

A data reproducing apparatus has a nonvolatile memory in addition to a memory for data processing. When data error is uncorrected, data and error correction codes other than uncorrected data are accumulated in the memory for data processing. Corrected data is coupled and repaired, and the repaired data is stored in the nonvolatile memory. It is possible to reproduce data without retry, even if data error is uncorrected when the data of an optical disc is reproduced at the next time.

5 Claims, 6 Drawing Sheets

DATA REPRODUCING APPARATUS

CLAIM OF PRIORITY

The present application claims priority from Japanese application JP2007-114996 filed on Apr. 25, 2007, the content of which is hereby incorporated by reference into this application.

BACKGROUND OF THE INVENTION

The present invention relates to a data reproducing apparatus.

For example, JP-2003-173633 describes the related art of this technical field. This Publication describes that "if an error correction process is impossible for data once read, for example, sector data, codeword rows and codeword columns not having error data in a datablock read by retry are overwritten in the datablock temporarily stored in a storage, to generate a new datablock so that error data in the datablock can be removed. Even if error data generated in the datablock cannot be removed completely, a possibility of correcting remaining error data can be improved by executing the error correction process for the new datablock, so that a data reproduction inability rate can be lowered and the number of rereading times by retry can be reduced".

SUMMARY OF THE INVENTION

A compact disc (CD) and a digital versatile disc (DVD) are typical examples of an optical disc, and these discs made readable include CD-R, CD-RW, DVD-RAM, DVD-R, DVD-RW and the like. In a reproducing apparatus for these optical discs, a static RAM (SRAM) and a dynamic RAM (DRAM) are used as a data error correction memory and a buffer memory.

For example, error correction codes are added in the following unit for DVD, and this error correction is executed on a memory. Error detection codes adopted for DVD are Cross Interleave Reed-Solomon Code (CIRC) which is used also for CD, DAT and the like and has a high error correction ability using an inner code parity (Parity Inner (PI)) and an outer code parity (Parity Outer (PO)). Data is divided in the unit of one byte and an identification address is added to form a sector. Collected sixteen sectors form a matrix, a PO code as a second error correction code is added to column direction data, and a PI code as a first correction code is added to row direction data. One sector has data of 2 Kbytes, and one process block is constituted of data of sixteen sectors (32 Kbytes) and error correction codes PI and PO.

When DVD is reproduced, data together with error correction codes are stored in a memory, and error correction is performed for each of PI series and PO series. After completion of error correction, scramble is removed and corrected data is output. If data error is uncorrected in the process block, a data rereading process called retry is executed to try again data reproduction.

However, if data reproduction cannot be completed in a predetermined time because the data error cannot be corrected even if retry is repeated, data reproduction is abandoned and an error code is sent.

According to JP-A-2003-173633, if an error correction process is impossible, a datablock temporarily stored in a storage is read by retry, sector data, codeword rows and codeword columns are overwritten in sector data not having error data in the read datablock to generate a new datablock so that error data in the datablock can be removed. Although data having uncorrected data can be reproduced in this manner, retry becomes necessary at the next reproduction.

It is an object of the present invention to reduce the number of retry times of data reproduction.

The above object can be achieved, for example, by repairing data unable to be reproduced even with a repetition of retry, and storing the repaired data.

According to the present invention, it is possible to reduce the number of retry times of data reproduction.

Other objects, features and advantages of the invention will become apparent from the following description of the embodiments of the invention taken in conjunction with the accompanying drawings.

DESCRIPTION OF THE EMBODIMENTS

Embodiments of the present invention will be described by applying the present invention to a DVD reproducing apparatus. The phrase "during reproduction" used in the following description is intended to mean that the reproducing apparatus operates in response to a reproduction command received from a host, unless otherwise specifically noted.

<First Embodiment>

Figure 1:
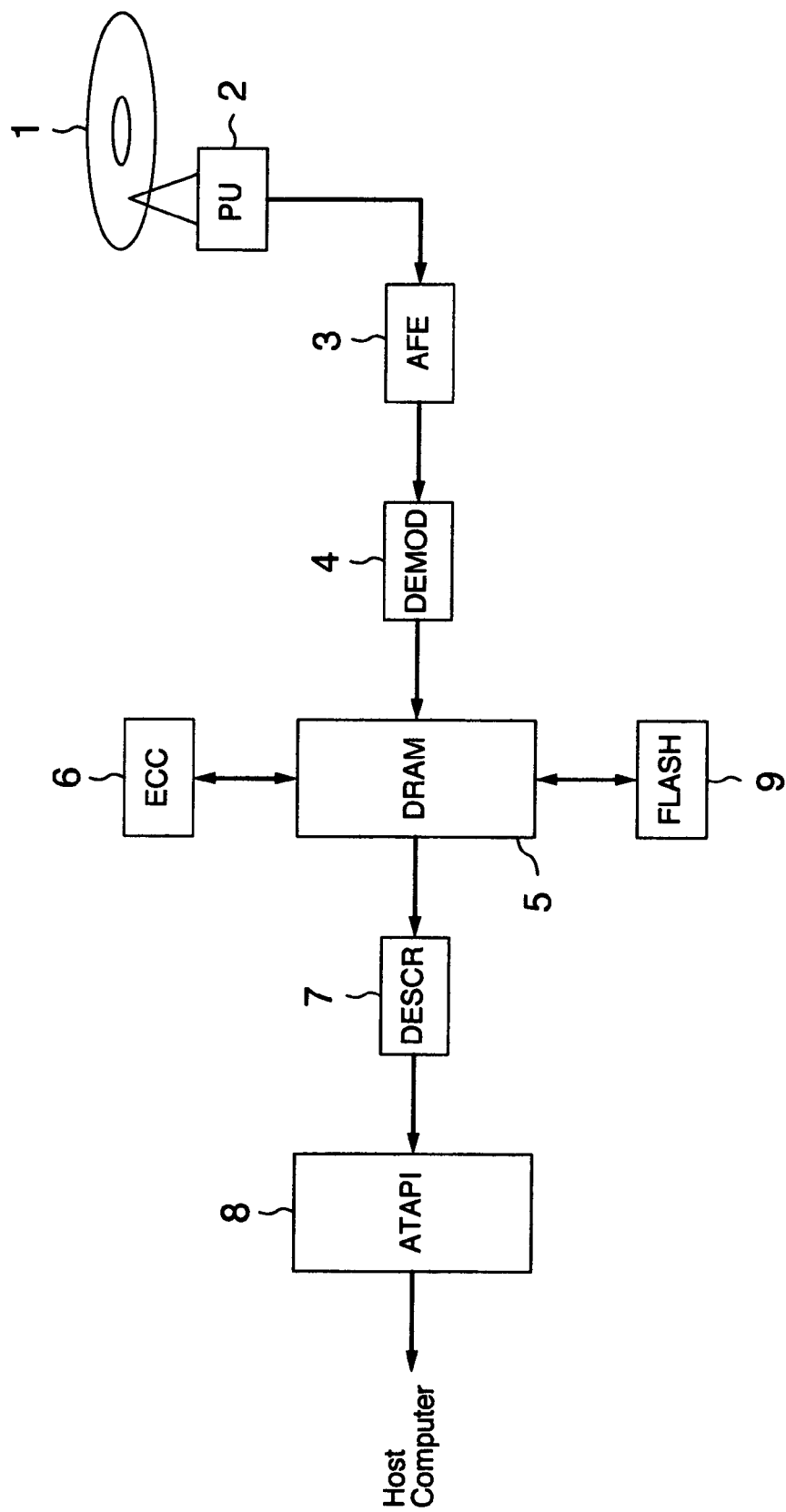
FIG. 1 is a block diagram showing the structure of a DVD reproducing apparatus according to a first embodiment.

FIG. 1 is a block diagram showing the structure of a DVD reproducing apparatus according to the first embodiment of the present invention. A reproduction signal read from an optical disc 1 via an optical pickup 2 is sent to an analog front end (AFE) 3 which amplifies the reproduction signal and outputs the amplified reproduction signal to a demodulator circuit 4. The demodulator circuit 4 binarizes and 8/16-demodulates the input signal, and writes the resultant signal in a DRAM 5 which is used as an error correction memory and a buffer memory. An error correction circuit 6 reads data from DRAM 5, executes an error correction process and writes the resultant data in DRAM 5. A descramble circuit 7 descrambles the data whose error correction was completed, and sends the resultant data to an ATAPI circuit 8 which sends the data supplied from the descramble circuit 7 to a host computer. A nonvolatile memory 9 stores the data and addresses whose error correction was completed. The data stored in the nonvolatile memory is written in a corresponding area of DRAM 5, by referring to the stored addresses.

When data is reproduced from DVD, a reproduction signal read from the optical disc 1 via the optical pickup 2 is first amplified at AFE 3, and then the demodulator circuit 4 binarizes and 8/16-demodulates the input signal and stores the resultant data in DRAM 5. Next, the error correction circuit 6 corrects errors of the data stored in DRAM 5. The data after error correction completion is sent to the descramble circuit 7 whereat descramble is performed, and the resultant data is output to the host computer via the ATAPI circuit 8.

If data error is uncorrected at the error correction circuit 6, data and error correction codes other than uncorrected data in the corresponding block are all copied to a different area of DRAM 5. Retry is performed and if data error is uncorrected again, among the data and error correction codes other than uncorrected data, data not copied to the other area of DRAM 5 at the preceding error correction is copied. Next, the error correction circuit 6 corrects errors. If data error is corrected, data is output to the host computer via the descramble circuit 7 and ATAPI circuit 8. The addresses of data with uncorrected data at the first time and data after error correction are sent to the nonvolatile memory 9.

If data error is uncorrected, retry is performed further, if data error is uncorrected again, among the data and error correction codes other than uncorrected data, data not copied to the other area of DRAM 5 up to this time is copied, and the error correction circuit 6 corrects errors. This operation is repeated until data error in DRAM 5 is corrected. When data error in DRAM 5 is corrected, the data is output to the host computer via the descramble circuit 7 and ATAPI circuit 8. The addresses of uncorrected data at the first time and the data after error correction are sent to the nonvolatile memory 9.

If data error is uncorrected at the next time when the optical disc is reproduced, error correction is performed after the data in the nonvolatile memory 9 is copied to the corresponding area of DRAM 5. In this manner, data can be reproduced without retry.

If there exist the addresses of uncorrected data and the data after error correction, erroneous data will not be sent to the host computer even if there are a plurality of optical discs with uncorrected data. If information inherent to each disc such as a title is sent to the nonvolatile memory 9, data selection necessary for error correction can be performed at high speed.

If occurrence of uncorrected data is notified by an alarm lamp or an alarm sound when data is sent to the nonvolatile memory 9, it becomes possible to notify a user of a bad optical disc state and to provoke user's attention. It is therefore possible for a user to recognize the bad optical disc state and make a countermeasure such as backing up the optical disc in advance.

The unit of data after error correction of uncorrected data at the first time to be sent to the nonvolatile memory 9 may be a PI series column unit, a PO series column unit, a sector unit or a block unit, respectively containing the data after error correction. In this case, although a data capacity occupying the nonvolatile memory 9 increases, the management of addresses becomes easy.

The addresses of uncorrected data and the data after error correction may be copied to another area of DRAM 5, without preparing the nonvolatile memory 9. However, in this case, data is disappears when the power is turned off, and data can be reproduced without retry only during the power-on period.

Data after error correction may not be sent to the nonvolatile memory 9 if data error is uncorrected even once, but the data after error correction may be sent to the nonvolatile memory 9 only when the number of retry times exceeds a preset value. In this case, although retry of data read once does not become unnecessary at the next and following times, the number of retry times can be suppressed so that the data capacity occupying the nonvolatile memory 9 can be reduced.

Data after error correction may be sent to the nonvolatile memory 9 when the number of error times exceeds a preset value, even if data error is corrected. In this case, although the data capacity occupying the nonvolatile memory 9 increases, since data in the area requiring future retry is stored in advance, occurrence of retry can be prevented even if this area has a new scratch or the like.

Figure 2:
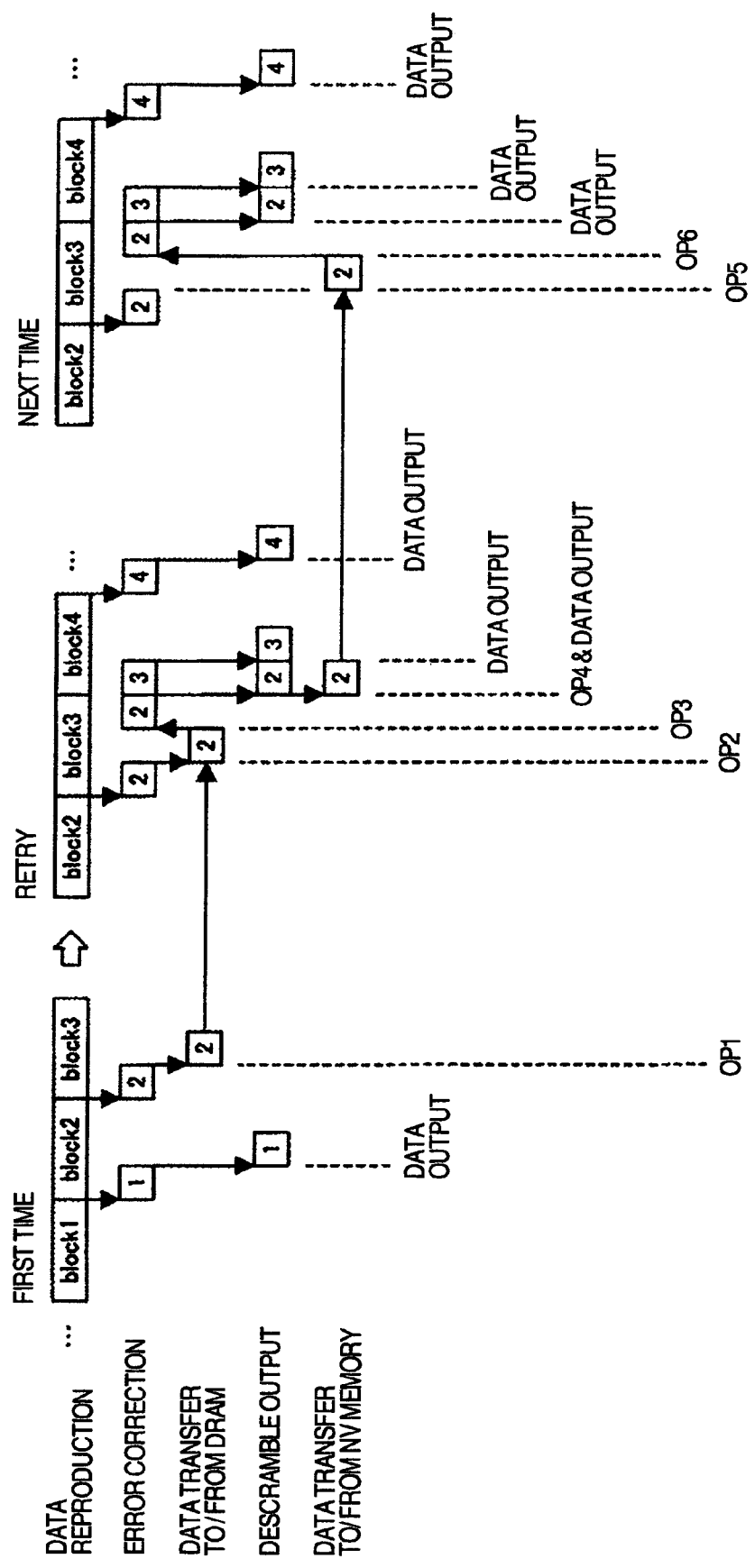
FIG. 2 is a timing chart illustrating the operation of the DVD reproducing apparatus of the first embodiment.

FIG. 2 is a timing chart illustrating a data reproducing operation of the DVD reproducing apparatus according to the first embodiment of the present invention. A reproduction signal read from the optical disc is 8/16-demodulated, and blocks 1, 2, 3, . . . are sequentially stored in DRAM. Data stored in DRAM is sequentially corrected and output by descrambling.

If data error is uncorrected in block 2, retry is performed to read again this block. All data in the block with uncorrected data is generally discarded at retry. However, in this embodiment, even if data error is uncorrected, data other than uncorrected data is copied to another area of DRAM and retained therein (OP1). If new corrected data exists in the retry, this new data is copied to the other area of DRAM (OP2), and the new data and old data are coupled to repair and reproduce (OP3). The addresses of uncorrected data at the first time and the data after error correction are copied to the nonvolatile (NV) memory (OP4), and when data error is uncorrected at the next time, this copied data is copied to the corresponding area of DRAM (OP5) and then error correction is performed (OP6).

FIG. 2 is a timing chart illustrating a case wherein all data is collected and output at the first retry. Thereafter, blocks 3, 4, . . . are sequentially reproduced. If all data is not corrected at the first retry, second, third, . . . retries are repeated until all data is collected.

Figure 3:
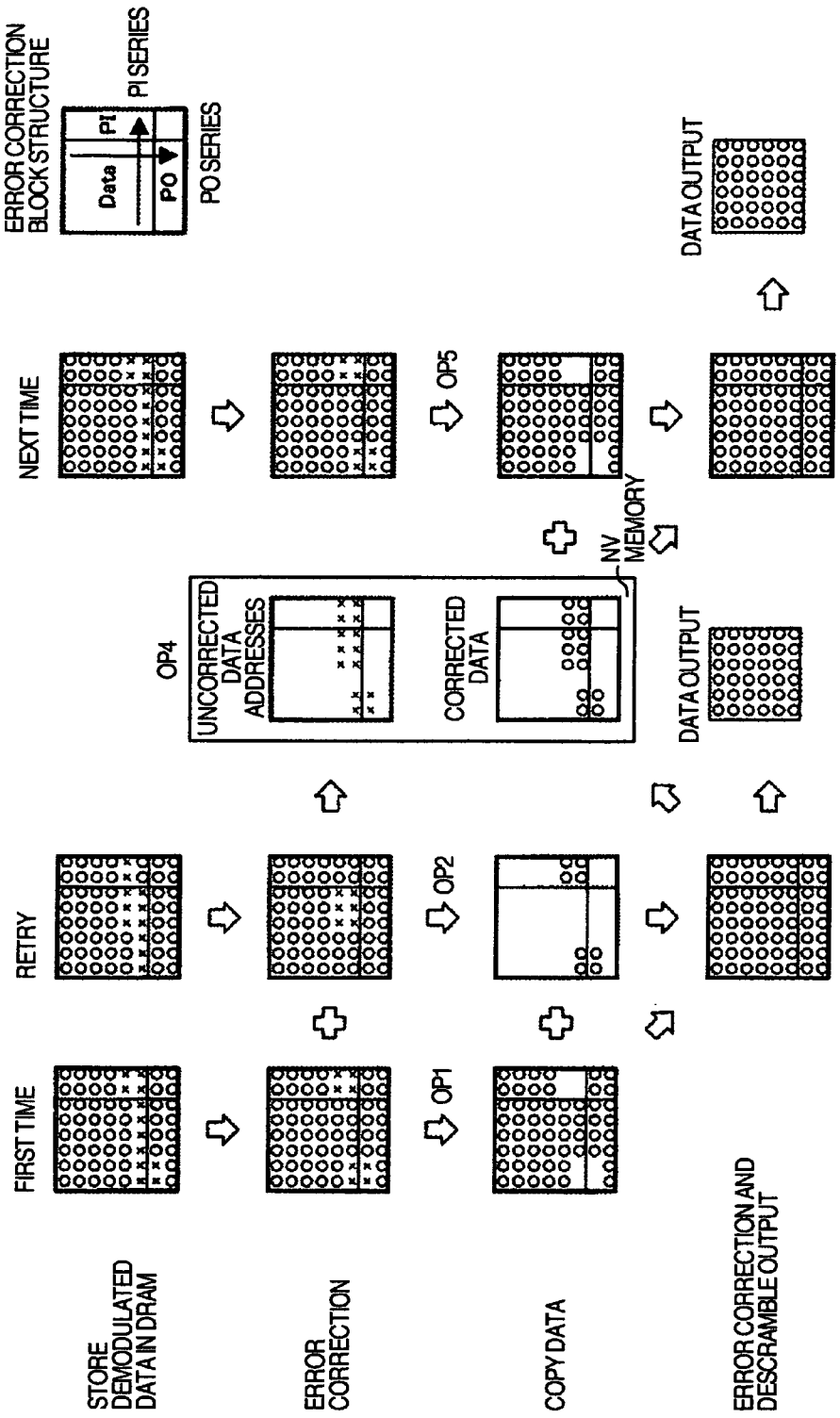
FIG. 3 is an illustrative diagram showing an error correction process of the DVD reproducing apparatus of the first embodiment.

FIG. 3 is a diagram illustrating an error correction operation of the DVD reproducing apparatus according to the first embodiment of the present invention. An error correction block of DVD is drawn in a simple form, and two error correction codes are added to each of PI and PO series. It is assumed each series has an error correction ability of correcting one error.

A plurality of series have two or more errors at the first reproduction, and data error is uncorrected. A plurality of series have two or more errors even at retry, and data error is uncorrected. Data other than uncorrected data is copied to another area of DRAM (OP1, OP2). When all data is filled at the first time plus at the retry, the data is output. The addresses of uncorrected data at the first time and the data after error correction are copied to the nonvolatile memory (OP4). When data error is uncorrected at the next reproduction, this data is copied to the corresponding area of DRAM (OP5) to thereafter perform error correction.

In the first embodiment of the present invention constructed as above, data and error correction codes other than uncorrected data are accumulated in another area, corrected data is coupled and repaired, and the repaired data is stored. It is therefore possible to reproduce data without retry, even if data error is uncorrected when the data of the optical disc is reproduced at the next time. Since retry for this data is not necessary, a data reproduction speed can be prevented from being lowered. In addition, for audio visual (AV) data having a limit in the number of retry times to prevent image freeze, it is possible to prevent generation of block noises to be caused by image missing because of a delay of data reproducing.

<Second Embodiment>

Figure 4:
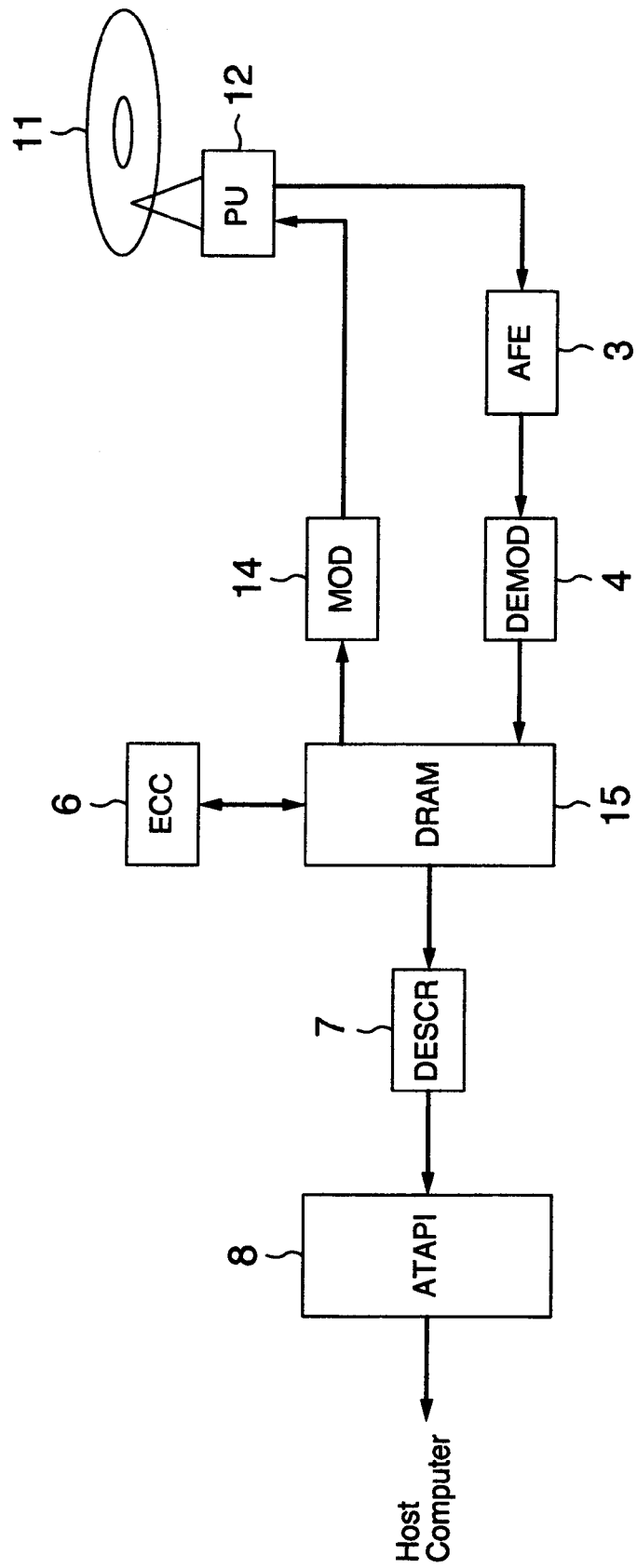
FIG. 4 is a block diagram showing the structure of a DVD reproducing apparatus according to a second embodiment.

FIG. 4 is a block diagram showing the structure of a DVD reproducing apparatus according to the second embodiment of the present invention. Description of identical parts to those shown in FIG. 1 is omitted. A signal read from a recordable optical disc 11 via an optical pickup 12 is sent to an AFE 3. An 8/16 modulation signal sent from a modulation circuit 14 is recorded in the optical disc 11. The modulation circuit 14 8/16-modulates data and error correction codes sent from a DRAM 15 and sends the resultant data to the optical pickup 12. DRAM 15 is used as an error correction memory and a buffer memory.

When data is reproduced from DVD, a reproduction signal read from the optical disk 11 via the optical pickup 12 is first amplified at AFE 3, and then the demodulator circuit 4 binarizes and 8/16-demodulates the input signal and stores the resultant data in DRAM 15. Next, the error correction circuit 6 corrects errors of the data stored in DRAM 15. The data after error correction completion is sent to a descramble circuit 7 whereat descramble is performed, and the resultant data is output to the host computer via an ATAPI circuit 8.

If data error is uncorrected at the error correction circuit 6, data and error correction codes other than uncorrected data in the corresponding block are all copied to a different area of DRAM 15. Retry is performed and if data error is uncorrected again, among the data and error correction codes other than uncorrected data, data not copied to the other area of DRAM 5 at the preceding error correction is copied. Next, the error correction circuit 6 corrects errors. If data error is corrected, data is output to the host computer via the descramble circuit 7 and ATAPI circuit 8. The data and error correction codes are 8/16-modulated by the modulation circuit 14 and recorded in the optical disc 11 via the optical pickup 12 in a predetermined data unit.

If data error is uncorrected, retry is performed further, if data error is uncorrected again, among the data and error correction codes other than uncorrected data, data not copied to the other area of DRAM 15 up to this time is copied, and the error correction circuit 6 corrects errors. This operation is repeated until data error in DRAM 15 is corrected. When data error in DRAM 15 is corrected, the data is output to the host computer via the descramble circuit 7 and ATAPI circuit 8. The data and error correction codes are 8/16-modulated by the modulation circuit 14, and recorded in the optical disc 11 via the optical pickup 12 in a predetermined data unit.

Data after error correction may not be written in the optical disc 11 if data error is uncorrected even once, but the data after error correction may be written in the optical disc 11 only when the number of retry times exceeds a preset value. In this case, although retry of data read once does not become unnecessary at the next and following times, the number of retry times can be suppressed.

If the number of errors exceeds a preset value even if data error is corrected, data after error correction may be recorded in the optical disc 11. In this case, although the frequency of recording data in the optical disc 11 increases, since data in the area requiring future try is stored in advance, occurrence of retry can be prevented even if this area has a new scratch or the like.

Data is recorded in an original area of the optical disc 11, or may be recorded in an alternative sector.

In the second embodiment of the present invention constructed as above, when data error is uncorrected, data and error correction codes other than uncorrected data are accumulated in another area, corrected data is coupled and repaired, and the repaired data is 8/16-modulated and recorded in the optical disc. It is therefore possible to reproduce at the next time the data in the optical disc without retry. Since retry for this data is not necessary, a data reproduction speed can be prevented from being lowered. In addition, for AV data having a limit in the number of retry times to prevent image freeze, it is possible to prevent generation of block noises to be caused by image missing because of a delay of data reproducing.

<Third Embodiment>

Figure 5:
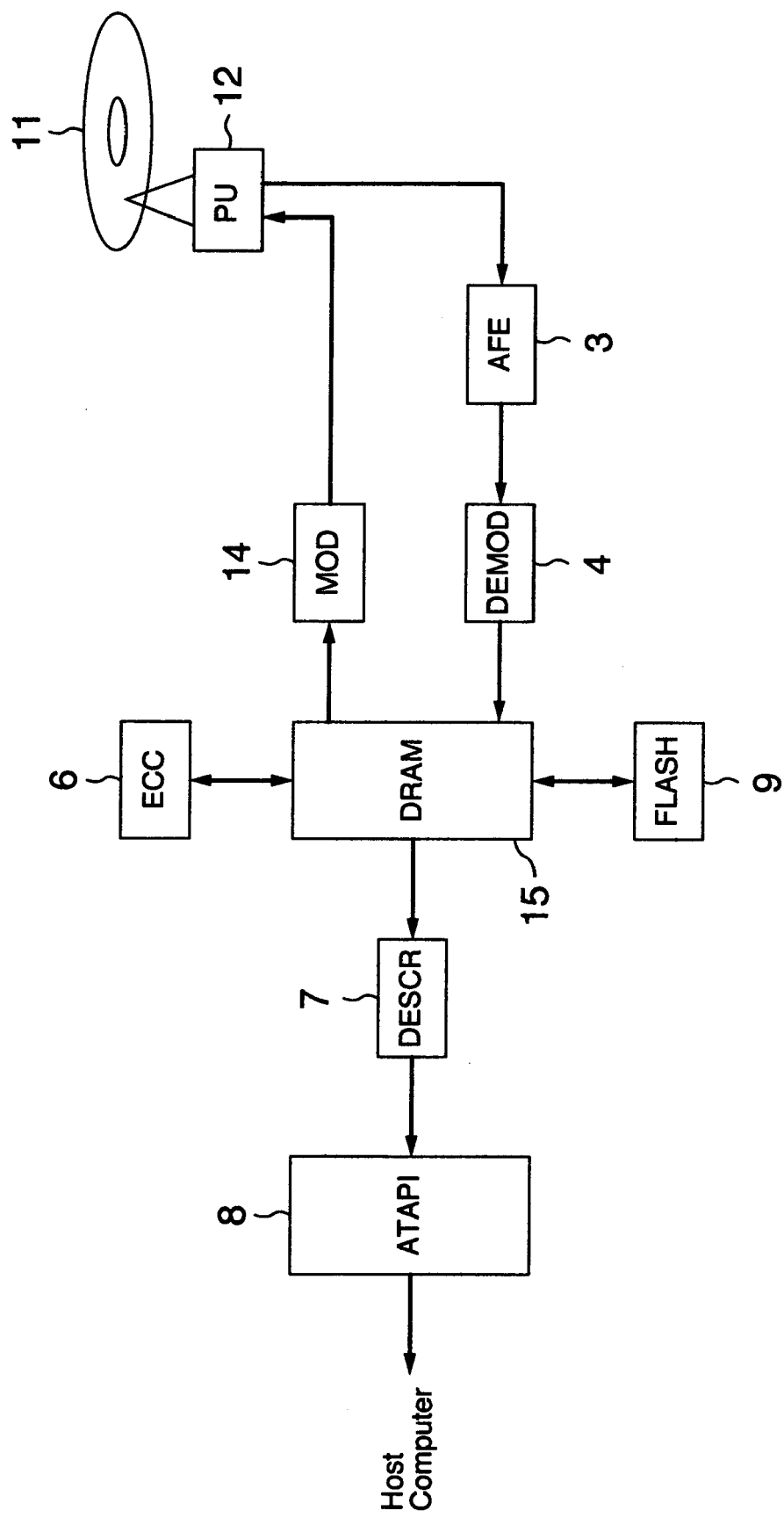
FIG. 5 is a block diagram showing the structure of a DVD reproducing apparatus according to a third embodiment.

FIG. 5 is a block diagram showing the structure of a DVD reproducing apparatus according to the third embodiment of the present invention. Description of identical parts to those shown in FIGS. 1 and 4 is omitted.

When data is reproduced from DVD, a reproduction signal read from an optical disc 11 via an optical pickup 12 is first amplified at an AFE 3, and then a demodulator circuit 4 binarizes and 8/16-demodulates the input signal and stores the resultant data in a DRAM 15. Next, an error correction circuit 6 corrects errors of the data stored in DRAM 15. The data after error correction completion is sent to a descramble circuit 7 whereat descramble is performed, and the resultant data is output to a host computer via an ATAPI circuit 8.

If data error is uncorrected at the error correction circuit 6, data and error correction codes other than uncorrected data in the corresponding block are all copied to a different area of DRAM 15. Retry is performed and if data error is uncorrected again, among the data and error correction codes other than uncorrected data, data not copied to the other area of DRAM 15 up to this time is copied. Next, the error correction circuit 6 corrects errors. If data error is corrected, data is output to the host computer via the descramble circuit 7 and ATAPI circuit 8. The addresses of uncorrected data at the first time and data after error correction are sent to the nonvolatile memory 9.

If data error is uncorrected, retry is performed further, if data error is uncorrected again, among the data and error correction codes other than uncorrected data, data not copied to the other area of DRAM 15 up to this time is copied, and the error correction circuit 6 corrects errors. This operation is repeated until data error in DRAM 15 is corrected. When data error in DRAM 15 is corrected, the data is output to the host computer via the descramble circuit 7 and ATAPI circuit 8. The addresses of uncorrected data at the first time and the data after error correction are sent to the nonvolatile memory 9.

If data error is uncorrected at the next time when the optical disc is reproduced, error correction is performed after the data in the nonvolatile memory 9 is copied to the corresponding area of DRAM 15. In this manner, data can be reproduced without retry.

If there exist the addresses of uncorrected data and the data after error correction, erroneous data will not be sent to the host computer even if there are a plurality of optical discs with uncorrected data. If information inherent to each disc such as a title is sent to the nonvolatile memory 9, data selection necessary for error correction can be performed at high speed.

If occurrence of uncorrected data is notified by an alarm lamp or an alarm sound when data is sent to the nonvolatile memory 9, it becomes possible to notify a user of a bad optical disc state and to provoke user's attention. It is therefore possible for a user to recognize the bad optical disc state and make a countermeasure such as backing up the optical disc in advance.

If a user instructs to repair the optical disc, error correction is performed after the data in the nonvolatile memory 9 is copied to the corresponding area of DRAM 15, and the data and error correction codes are 8/16-modulated by the modulation circuit 14 and recorded in the optical disc 11 via the optical pickup 12 in a predetermined data unit.

The data is recorded in the original area of the optical disc 11, or may be recorded in an alternative sector.

The unit of data after error correction of uncorrected data at the first time to be sent to the nonvolatile memory 9 may be a PI series column unit, a PO series column unit, a sector unit or a block unit, respectively containing the data after error correction. In this case, although a data capacity occupying the nonvolatile memory 9 increases, the management of addresses becomes easy.

The addresses of uncorrected data and the data after error correction may be copied to another area of DRAM 15, without preparing the nonvolatile memory 9. However, in this case, data is disappears when the power is turned off, and data can be reproduced without retry only during the power-on period.

Data after error correction may not be sent to the nonvolatile memory 9 if data error is uncorrected even once, but the data after error correction may be sent to the nonvolatile memory 9 only when the number of retry times exceeds a preset value. In this case, although retry of data read once does not become unnecessary at the next and following times, the number of retry times can be suppressed so that the data capacity occupying the nonvolatile memory 9 can be reduced.

Data after error correction may be sent to the nonvolatile memory 9 when the number of error times exceeds a preset value, even if data error is corrected. In this case, although the data capacity occupying the nonvolatile memory 9 increases, since data in the area requiring future try is stored in advance, occurrence of retry can be prevented even if this area has a new scratch or the like.

In the third embodiment of the present invention constructed as above, when data error is uncorrected, data and error correction codes other than uncorrected data are accumulated in another area, corrected data is coupled and repaired, and the repaired data is stored in the nonvolatile memory. It is therefore possible to reproduce data without retry, even if data error is uncorrected when the data of the optical disc is reproduced at the next time. Since retry for this data is not necessary, a data reproduction speed can be prevented from being lowered. In addition, for AV data having a limit in the number of retry times to prevent image freeze, it is possible to prevent generation of block noises to be caused by image missing because of a delay of data reproducing. Furthermore, at any time when a user instructs to repair the optical disc, the optical disc can be repaired by using the data stored in the nonvolatile memory.

<Fourth Embodiment>

Figure 6:
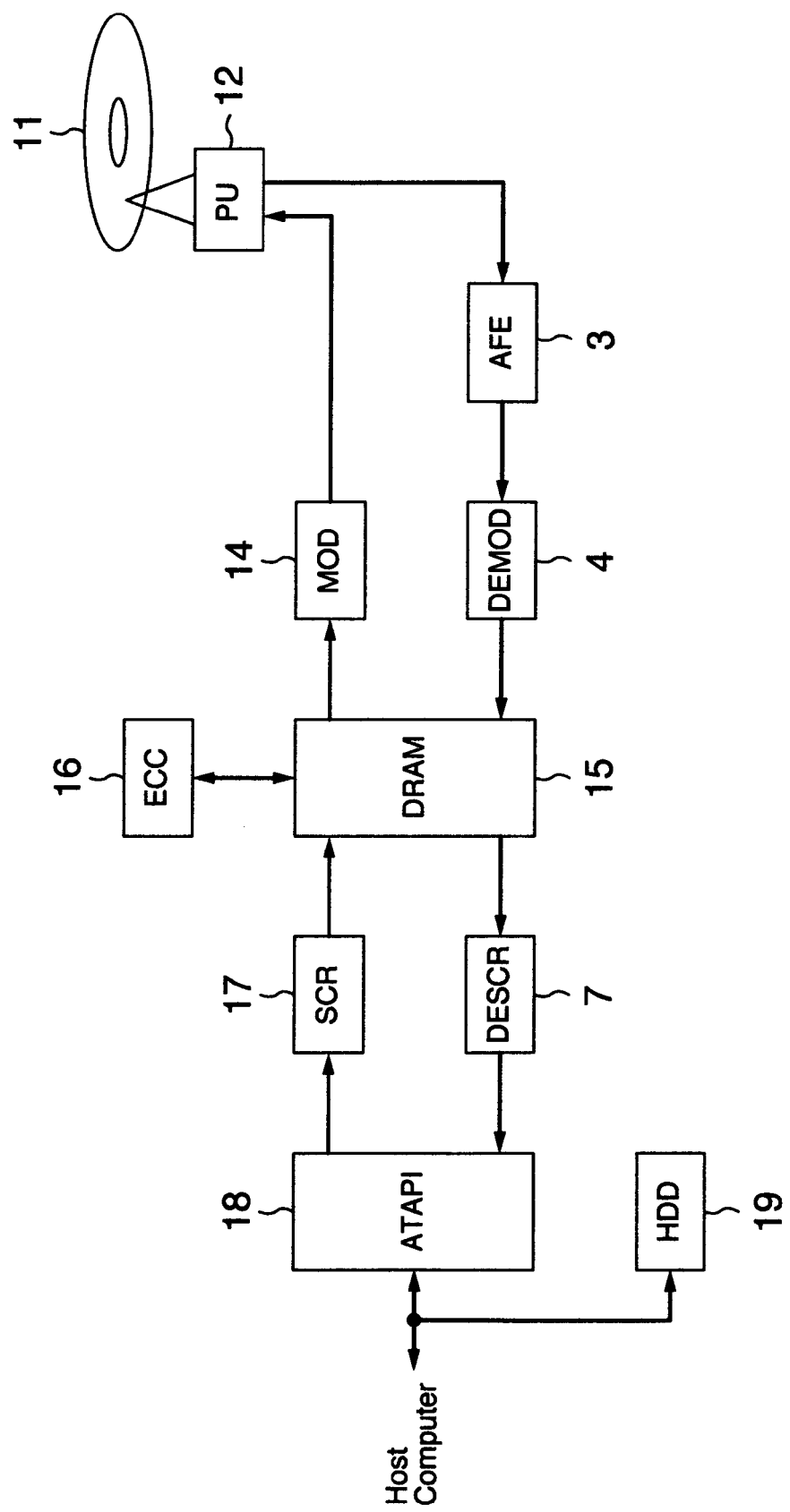
FIG. 6 is a block diagram showing the structure of a DVD recording/reproducing apparatus according to a fourth embodiment.

FIG. 6 is a block diagram showing the structure of a DVD reproducing apparatus according to the fourth embodiment of the present invention. Description of identical parts to those shown in FIGS. 1, 4 and 5 is omitted. An error correction and error correction code adding circuit 16 reads data from a DRAM 15, corrects errors and writes the resultant data in DRAM 15. The error correction and error correction code adding circuit 16 also reads data from DRAM 15, adds error correction codes, and writes the resultant data in DRAM 15. A scramble circuit 17 scrambles data sent from an ATAPI circuit 18, and writes the resultant data in DRAM 15. The ATAPI circuit 18 sends data supplied from a descramble circuit 7 to a host computer, or sends data supplied from the host computer to the scramble circuit 17. A hard disc drive (HDD) 19 stores data via the ATAPI circuit 18.

When data is recorded in a DVD, the data sent from the host computer via the ATAPI circuit 18 is first scrambled at the scramble circuit 17 and stored in DRAM 15. Next, the data stored in DRAM 15 is read to the error correction and error correction code adding circuit 16 to generate error correction codes on DRAM 15. The data and error correction codes in DRAM 15 are 8/16-modulated at a modulation circuit 14 and recorded in an optical disc 11 via an optical disc pickup 12.

When data is reproduced from DVD, a reproduction signal read from the optical disc 11 via the optical pickup 12 is first amplified at an AFE 3, and then a demodulator circuit 4 binarizes and 8/16-demodulates the input signal and stores the resultant data in DRAM 15. Next, the error correction and error correction code adding circuit 16 corrects errors of the data stored in DRAM 15. The data after error correction completion is sent to a descramble circuit 7 whereat descramble is performed, and the resultant data is output to the host computer via the ATAPI circuit 18.

If data error is uncorrected at the error correction and error correction code adding circuit 16, data and error correction codes other than uncorrected data in the corresponding block are all copied to a different area of DRAM 15. Retry is performed and if data error is uncorrected again, among the data and error correction codes other than uncorrected data, data not copied to the other area of DRAM 15 up to this time is copied. Next, the error correction and error correction code adding circuit 16 corrects errors. If data error is corrected, data is output to the host computer via the descramble circuit 7 and ATAPI circuit 18. The addresses of uncorrected data at the first time and data after error correction are sent to HDD 19.

If data error is uncorrected, retry is performed further, if data error is uncorrected again, among the data and error correction codes other than uncorrected data, data not copied to the other area of DRAM 15 up to this time is copied, and the error correction and error correction code adding circuit 16 corrects errors. This operation is repeated until data error in DRAM 15 is corrected. When data error in DRAM 15 is corrected, the data is output to the host computer via the descramble circuit 7 and ATAPI circuit 18. The addresses of uncorrected data at the first time and the data after error correction are sent to HDD 19.

If data error is uncorrected at the next time when the optical disc is reproduced, error correction is performed after the data in HDD 19 is copied to the corresponding area of DRAM 15. In this manner, data can be reproduced without retry.

Scramble of data to be sent to HDD 19 may not be removed. In this case, the data is not scrambled when the data is supplied from HDD 19 to DRAM 15.

If there exist the addresses of uncorrected data and the data after error correction, erroneous data will not be sent to the host computer even if there are a plurality of optical discs with uncorrected data. If information inherent to each disc such as a title is sent to HDD 19, data selection necessary for error correction can be performed at high speed.

If the data and the like after error correction stored in HDD 19 are transferred to DRAM 15 when the power is turned on, when the optical disc is loaded, or at other timings, a data transfer time from HDD 19 does not exist when data error is uncorrected, and error correction using the data can be performed at once.

If information inherent to the disc such as a title is stored in HDD 19, only the data necessary for the disc can be transferred to DRAM 15 when the power is turned on, when the optical disc is loaded, or at other timings, and a wasteful transfer from HDD 19 can be prevented.

If occurrence of uncorrected data is notified by an alarm lamp or an alarm sound when data is sent to HDD 19, it becomes possible to notify a user of a bad optical disc state and to provoke user's attention.

If a user instructs to repair the optical disc, error correction is performed after the data in HDD 19 is copied to the corresponding area of DRAM 15, and the data and error correction codes are 8/16-modulated by the modulation circuit 14 and recorded in the optical disc 11 via the optical pickup 12 in a predetermined data unit.

The data is recorded in the original area of the optical disc 11, or may be recorded in an alternative sector.

The unit of data after error correction of uncorrected data at the first time to be sent to HDD 19 may be a PI series column unit, a PO series column unit, a sector unit or a block unit, respectively containing the data after error correction. In this case, although a data capacity occupying HDD 19 increases, the management of addresses becomes easy.

The optical disc may be repaired by reproducing the whole surface of the optical disc 11, storing all data in HDD 19, and recording all the data in the optical disc 11 or another optical disc.

Data after error correction may not be sent to HDD 19 if data error is uncorrected even once, but the data after error correction may be sent to HDD 19 only when the number of retry times exceeds a preset value. In this case, although retry of data read once does not become unnecessary at the next and following times, the number of retry times can be suppressed so that the data capacity occupying HDD 19 can be reduced.

Data after error correction may be sent to HDD 19 when the number of error times exceeds a preset value, even if data error is corrected. In this case, although the data capacity occupying HDD 19 increases, since data in the area requiring future retry is stored in advance, occurrence of retry can be prevented even if this area has a new scratch or the like.

In the fourth embodiment of the present invention constructed as above, when data error is uncorrected, data and error correction codes other than uncorrected data are accumulated in another area, corrected data is coupled and repaired, and the repaired data is stored in HDD. It is therefore possible to reproduce data without retry, even if data error is uncorrected when the data of the optical disc is reproduced at the next time. Since retry for this data is not necessary, a data reproduction speed can be prevented from being lowered. In addition, for AV data having a limit in the number of retry times to prevent image freeze, it is possible to prevent generation of block noises to be caused by image missing because of a delay of data reproducing. Furthermore, at any time when a user instructs to repair the optical disc, the optical disc can be repaired by using the data stored in HDD.

In each embodiment, the present invention is applied to the DVD reproducing apparatus or DVD recording/reproducing apparatus. It is obvious that each embodiment is applied to both the DVD reproducing apparatus and DVD recording/reproducing apparatus. The present invention is not limited to the embodiments described above, but the present invention can be reduced in practice in various modifications without departing from the gist of the present invention.

The invention claimed is:

1. A data reproducing apparatus for reading data from a recording medium in accordance with a reproduction command from a host, the data being stored in said recording medium by adding error correction codes, and correcting an error of said data and outputting said corrected data, the data reproducing apparatus comprising:
   first storage means for temporarily storing data;
   error correcting means for correcting an error of said data stored in said first storage means; and
   second storage means for storing said data whose error was corrected by said error correcting means,
   wherein:
   when data error is uncorrected at said error correcting means, said data is read again, and corrected data is transferred from said first storage means to said second storage means to be stored in said second storage means; and
   when data error is uncorrected at a next data reproduction, said data stored in said second storage means is transferred to said first storage means.

2. The data reproducing apparatus according to claim 1, wherein if data error is corrected after the number of data rereading times exceeds a preset value upon data reading from said recording medium, corrected data is transferred from said first storage means to said second storage means.

3. The data reproducing apparatus according to claim 1, wherein if the number of data errors exceeds a preset value upon data reading from said recording medium, after errors of said data are corrected, said error-corrected data is transferred from said first storage means to said second storage means.

4. The data reproducing apparatus according to claim 1, wherein when data after error correction completion is transferred from said first storage means to said second storage means, occurrence of non-correction of said data is notified by an alarm light or an alarm sound.

5. The data reproducing apparatus according to claim 4, wherein when a user instructs to repair said recording medium, error correction is performed after said data stored in said second storage means is transferred to said first storage means, and said data is recorded in a predetermined area or an alternative sector of said recording medium in a predetermined data unit.

* * * * *